United States Patent
Son et al.

(10) Patent No.: US 10,159,162 B2
(45) Date of Patent: Dec. 18, 2018

(54) CONNECTOR AND ELECTRONIC DEVICE INCLUDING THE SAME

(71) Applicant: Samsung Electronics Co., Ltd, Gyeonggi-do (KR)

(72) Inventors: Wangik Son, Gyeonggi-do (KR); Sunghyun Kim, Gyeonggi-do (KR); Eungwon Kim, Gyeonggi-do (KR); Seungbum Choi, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/430,281

(22) Filed: Feb. 10, 2017

(65) Prior Publication Data

US 2017/0265322 A1 Sep. 14, 2017

(30) Foreign Application Priority Data

Mar. 10, 2016 (KR) .................. 10-2016-0028895

(51) Int. Cl.

| | | |
|---|---|---|
| H01R 12/00 | (2006.01) | |
| H05K 7/14 | (2006.01) | |
| H01R 24/50 | (2011.01) | |
| H01R 24/60 | (2011.01) | |
| H05K 1/02 | (2006.01) | |
| H05K 1/11 | (2006.01) | |
| H01R 12/71 | (2011.01) | |
| H01R 107/00 | (2006.01) | |

(52) U.S. Cl.
CPC ......... H05K 7/1427 (2013.01); H01R 12/712 (2013.01); H01R 24/50 (2013.01); H01R 24/60 (2013.01); H05K 1/0237 (2013.01); H05K 1/115 (2013.01); *H01R 2107/00* (2013.01)

(58) Field of Classification Search
CPC ....... H05K 7/1427; H01R 12/712; H04B 1/16
USPC .................... 439/660, 63; 455/205
See application file for complete search history.

(56) References Cited

U.S. PATENT DOCUMENTS

| | | | | |
|---|---|---|---|---|
| 5,795,162 A | * | 8/1998 | Lambert ................ | H01P 1/047 333/260 |
| 8,412,138 B2 | * | 4/2013 | Li ......................... | H05K 1/117 455/205 |
| 2005/0012628 A1 | * | 1/2005 | Kadner .................. | G01W 1/10 340/601 |
| 2008/0124086 A1 | * | 5/2008 | Matthews ............. | H04H 20/61 398/115 |
| 2008/0287005 A1 | * | 11/2008 | Kameda ................ | G06F 1/184 439/498 |

(Continued)

FOREIGN PATENT DOCUMENTS

| | | |
|---|---|---|
| KR | 1020000063230 | 11/2000 |
| KR | 101514892 | 4/2015 |
| KR | 1020150059074 | 5/2015 |

*Primary Examiner* — Abdullah Riyami
*Assistant Examiner* — Nader Alhawamdeh

(57) ABSTRACT

A connector and an electronic device having the connector are disclosed. The connector includes: a housing formed with an insulator and mounted at a substrate in order to process a digital signal; a pair of sockets that process a Radio Frequency (RF) signal; a pair of terminals formed at a sub PCB in order to process the RF signal; and a signal processor that processes the RF signal and the digital signal. Various embodiments of the present disclosure are possible.

20 Claims, 15 Drawing Sheets

(56) References Cited

U.S. PATENT DOCUMENTS

| | | | |
|---|---|---|---|
| 2010/0248503 A1* | 9/2010 | Kang | H01R 24/50 439/63 |
| 2014/0167292 A1* | 6/2014 | Masumura | H01L 25/18 257/784 |
| 2014/0334312 A1* | 11/2014 | Rivingston | H04W 74/0816 370/241 |
| 2015/0244404 A1* | 8/2015 | Liu | H03G 3/3036 455/234.1 |

* cited by examiner

CONNECTOR AND ELECTRONIC DEVICE INCLUDING THE SAME

CROSS-REFERENCE TO RELATED APPLICATION(S) AND CLAIM OF PRIORITY

The present application is based on and claims priority under 35 U.S.C. § 119 to a Korean patent application filed on Mar. 10, 2016 in the Korean Intellectual Property Office and assigned Serial number 10-2016-0028895, the disclosure of which is incorporated by reference herein in its entirety.

TECHNICAL FIELD

Various exemplary embodiments of the present disclosure relate to a connector and an electronic device including the same.

BACKGROUND

Electronic devices may include various modules such as at least one communication antenna module, speaker module, microphone module, vibrator for vibration, main board, touchscreen panel device, and battery pack. In order to implement various functions of the components, a plurality of printed circuit boards (PCBs) of various sizes may be mounted, and many signals are individually or simultaneously transmitted and received between the PCBs.

Nowadays, at a most front surface of an electronic device, a display having a touch screen function is formed and thus it is difficult to secure a mounting space at a main board.

According to various exemplary embodiments, the electronic device may include at least one PCB and connect a signal between PCBs using a board-to-board (B-to-B) type connector and/or a coaxial cable.

In an electronic device according to various exemplary embodiments, when a radio frequency (RF) cable and a B-to-B type connector are used, a material cost may increase and/or a mounting space shortage phenomenon of a board may occur.

In another example, when an RF cable and a B-to-B type connector are used, the assembly work number may increase and/or productivity may be deteriorated.

SUMMARY

To address the above-discussed deficiencies, it is a primary object to provide a connector which includes: a housing formed with an insulator and mounted at a substrate in order to process a digital signal; a pair of sockets that process a radio frequency (RF) signal; a pair of terminals formed at a sub PCB in order to process the RF signal; and a signal processor that processes the RF signal and the digital signal.

In accordance with an another example aspect of the present disclosure, an electronic device comprises: a connector including a housing formed with an insulator and mounted at a substrate in order to process a digital signal; a pair of sockets that process a radio frequency (RF) signal; a pair of terminals formed at a sub printed circuit board (PCB) in order to process the RF signal; and a signal processor implemented into a digital signal wiring portion and a pair of RF signal wiring portions in order to process the RF signal and the digital signal; and another party connector that mounts a housing and header formed to correspond to the connector to insert the connector or inserted and coupled in a vertical direction to the connector.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
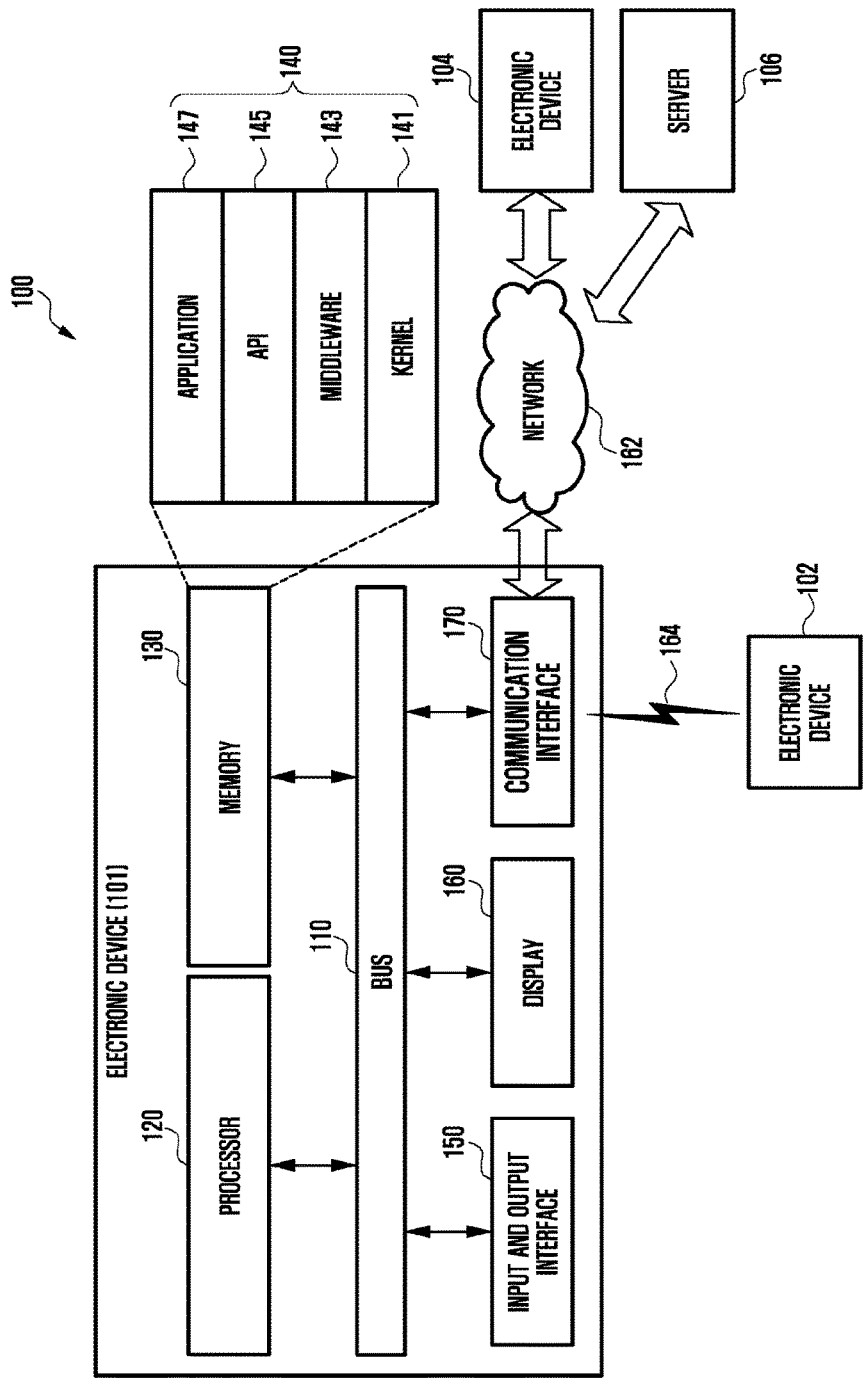
FIG. 1 illustrates a configuration of an electronic device according to an embodiment of the present disclosure.

FIGS. 1 through 15, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, the present disclosure will be described with reference to the accompanying drawings. Although specific embodiments are illustrated in the drawings and related detailed descriptions are discussed in the present specification, the present disclosure may have various modifications and several embodiments. However, various embodiments of the present disclosure are not limited to a specific implementation form and it should be understood that the present disclosure includes all changes and/or equivalents and substitutes included in the spirit and scope of various embodiments of the present disclosure. In connection with descriptions of the drawings, similar components are designated by the same reference numeral.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

In various embodiments of the present disclosure, the expression "or" or "at least one of A or/and B" includes any or all of combinations of words listed together. For example, the expression "A or B" or "at least A or/and B" may include A, may include B, or may include both A and B.

The expression "1", "2", "first", or "second" used in various embodiments of the present disclosure may modify various components of the various embodiments but does not limit the corresponding components. For example, the above expressions do not limit the sequence and/or importance of the components. The expressions may be used for distinguishing one component from other components. For example, a first user device and a second user device indicate different user devices although both of them are user devices. For example, without departing from the scope of the present disclosure, a first structural element may be referred to as a second structural element. Similarly, the second structural element also may be referred to as the first structural element.

The expression "configured to" uses in the present disclosure may be replaced, according to situations, with "suitable for". "having the capacity to", "designed to", "adapted to", "made to", or "capable of". The term "configured to" may not always mean "specially designed to". In some situations, "device configured to" may mean that the device can "do something" with other devices or components. For example, a context "processor configured to execute A, B, and C" may mean a dedicated processor (for example, embedded processor) for executing a corresponding operation, or a generic-purpose processor (for example, CPU or application processor) capable of executing corresponding operations by using at least one software program stored in a memory device.

The terms used in the present disclosure is to merely describe a specific embodiment, and is not intended to limit the scope of other embodiments. A singular form may include a plural form. All the terms including a technical or scientific term may have the same meaning as terms generally understood by those skilled in the prior art. The terms defined in a general dictionary may be interpreted as having the same or similar meaning in a context of related technology, and are not interpreted abnormally or excessively unless clearly defined in the present disclosure. According to situations, the terms defined in the present disclosure cannot be interpreted as excluding the embodiments of the present disclosure.

An electronic device according to various embodiments of the present disclosure may be a device including a projection or a communication function. For example, the electronic device may be one or a combination of a smart phone, a tablet personal computer (PC), a mobile phone, a video phone, an e-book reader, a desktop PC, a laptop PC, a netbook computer, a personal digital assistant (PDA), a camera, a wearable device (for example, a head-mounted-device (HMD) such as electronic glasses, electronic clothes, and electronic bracelet, an electronic necklace, an electronic appcessary, an electronic tattoo, and a smart watch.

According to some embodiments, the electronic device may be a smart home appliance having a projection function. The smart home appliance may include at least one of a television (TV), a digital video disk (DVD) player, an audio player, an air conditioner, a cleaner, an oven, a microwave oven, a washing machine, an air cleaner, a set-top box, a TV box (for example, Samsung HomeSync™, Apple TV™, or Google TV™), game consoles, an electronic dictionary, an electronic key, a camcorder, and an electronic frame.

According to some embodiments, the electronic device may include at least one of various types of medical devices (for example, magnetic resonance angiography (MRA), magnetic resonance imaging (MRI), computed tomography (CT), a scanner, an ultrasonic device and the like), a navigation device, a global positioning system (GPS) receiver, an event data recorder (EDR), a flight data recorder (FDR), a vehicle infotainment device, electronic equipment for a ship (for example, a navigation device for ship, a gyro compass and the like), avionics, a security device, a head unit for a vehicle, an industrial or home robot, an automatic teller machine (ATM) of financial institutions, and a point of sale (POS) device of shops.

According to some embodiments, the electronic device may include at least one of furniture or a part of a building/structure, an electronic board, an electronic signature receiving device, a projector, and various types of measuring devices (for example, a water meter, an electricity meter, a gas meter, a radio wave meter and the like) including a projection function. The electronic device according to various embodiments of the present disclosure may be one or a combination of the above described various devices. Further, the electronic device according to various embodiments of the present disclosure may be a flexible device. It is apparent to those skilled in the art that the electronic device according to various embodiments of the present disclosure is not limited to the above described devices The exemplary embodiments disclosed in the specification and drawings are merely presented to easily describe technical contents of the present disclosure and help the understanding of the present disclosure and are not intended to limit the scope of the present disclosure. Therefore, all changes or modifications derived from the technical idea of the present disclosure as well as the embodiments described herein should be interpreted to belong to the scope of the present disclosure.

FIG. 1 illustrates a configuration of an electronic device according to an embodiment of the present disclosure.

Referring to FIG. 1, the electronic device 100 may include a bus 110, a processor 120, a memory 130, a user input/output interface 150, a display 160, a communication interface 170, and other similar and/or suitable components.

The bus 110 may be a circuit which interconnects the above-described elements and delivers a communication (e.g., a control message) between the above-described elements.

The processor 120 may receive commands from the above-described other elements (e.g., the memory 130, the user input/output interface 150, the display 160, the communication interface 170, etc.) through the bus 110, may interpret the received commands, and may execute calculation or data processing according to the interpreted commands.

The memory 130 may store commands or data received from the processor 120 or other elements (e.g., the user input/output interface 150, the display 160, the communication interface 170, etc.) or generated by the processor 120 or the other elements. The memory 130 may include programming modules 140, such as a kernel 141, middleware 143, an application programming interface (API) 145, an application 147, and the like. Each of the above-described programming modules may be implemented in software, firmware, hardware, or a combination of two or more thereof.

The kernel 141 may control or manage system resources (e.g., the bus 110, the processor 120, the memory 150, etc.) used to execute operations or functions implemented by other programming modules (e.g., the middleware 143, the API 145, and the application 147). Also, the kernel 141 may provide an interface capable of accessing and controlling or managing the individual elements of the electronic device 100 by using the middleware 143, the API 145, or the application 147.

The middleware 143 may serve to go between the API 145 or the application 147 and the kernel 141 in such a manner that the API 145 or the application 147 communicates with the kernel 141 and exchanges data therewith. Also, in relation to work requests received from one or more applications 147 and/or the middleware 143, for example, may perform load balancing of the work requests by using a method of assigning a priority, in which system resources (e.g., the bus 110, the processor 120, the memory 150, etc.) of the electronic device 100 can be used, to at least one of the one or more applications 147.

The API 145 is an interface through which the application 147 is capable of controlling a function provided by the kernel 141 or the middleware 143, and may include, for example, at least one interface or function for file control, window control, image processing, character control, or the like.

The user input/output interface 150, for example, may receive a command or data as input from a user, and may deliver the received command or data to the processor 120 or the memory 130 through the bus 110. The display 160 may display a video, an image, data, or the like to the user.

The communication interface 170 may connect communication between another electronic device 102 and the electronic device 100. The communication interface 170 may support a predetermined short-range communication protocol (e.g., Wi-Fi, BlueTooth (BT), and near field communication (NFC)), or predetermined network communication 162 (e.g., the Internet, a local area network (LAN), a wide area network (WAN), a telecommunication network, a cellular network, a satellite network, a plain old telephone service (POTS), or the like). Each of the electronic devices 102 and 104 may be a device which is identical (e.g., of an identical type) to or different (e.g., of a different type) from the electronic device 100. Further, the communication interface 170 may connect communication between a server 106 and the electronic device 100 via the network 162.

Figure 2:
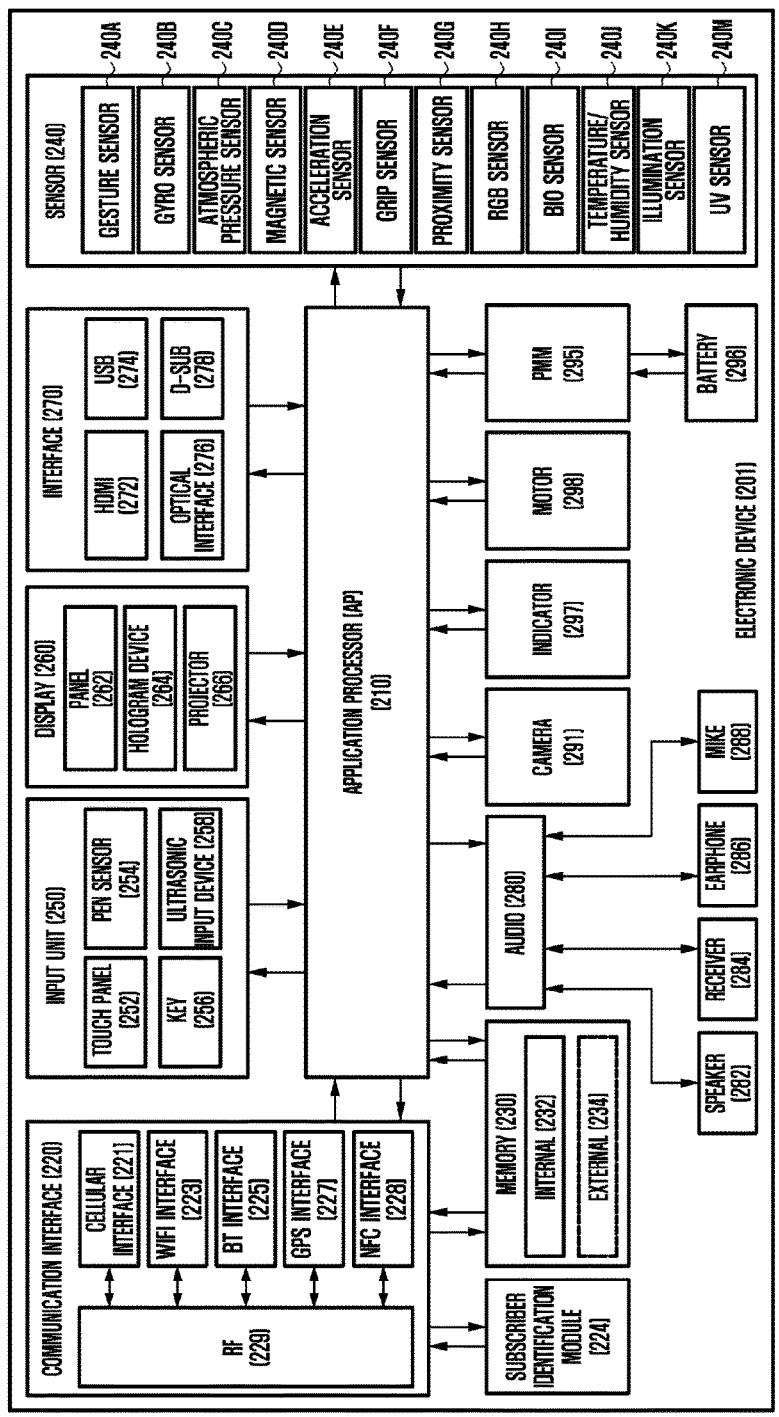
FIG. 2 illustrates another configuration of an electronic device according to an embodiment of the present disclosure.

FIG. 2 illustrates another configuration of an electronic device 201 according to an embodiment of the present disclosure.

The electronic device 201 may be, for example, hardware of the electronic device 100 illustrated in FIG. 1.

Referring to FIG. 2, the electronic device 201 may include one or more processors 210, a Subscriber Identification Module (SIM) card 224, a memory 230, a communication interface 220, a sensor 240, a user input unit 250, a display 260, an interface 270, an audio 280, a camera 291, a power management module 295, a battery 296, an indicator 297, a motor 298 and any other similar and/or suitable component.

The processor 210 (e.g., the processor 120) may include one or more application processors (APs), or one or more communication processors (CPs). The processor 210 may be, for example, the processor 120 illustrated in FIG. 1. The AP and the CP are illustrated as being included in the processor 210 in FIG. 2, but may be included in different integrated circuit (IC) packages, respectively. According to an embodiment of the present disclosure, the AP and the CP may be included in one IC package.

The AP may execute an operating system (OS) or an application program, and thereby may control multiple hardware or software elements connected to the AP and may perform processing of and arithmetic operations on various data including multimedia data. The AP may be implemented by, for example, a system on chip (SoC). According to an embodiment of the present disclosure, the processor 210 may further include a graphical processing unit (GPU) (not illustrated).

The CP may manage a data line and may convert a communication protocol in the case of communication between the electronic device (e.g., the electronic device 100) including the hardware of the electronic device 201 and different electronic devices connected to the electronic device through the network. The CP may be implemented by, for example, a SoC. According to an embodiment of the present disclosure, the CP may perform at least some of multimedia control functions. The CP, for example, may distinguish and authenticate a terminal in a communication network by using a subscriber identification module (e.g., the SIM card 224). Also, the CP may provide the user with services, such as a voice telephony call, a video telephony call, a text message, packet data, and the like.

Further, the CP may control the transmission and reception of data by the communication interface 220. In FIG. 2, the elements such as the CP, the power management module 295, the memory 230, and the like are illustrated as elements separate from the AP. However, according to an embodiment of the present disclosure, the AP may include at least some (e.g., the CP) of the above-described elements.

According to an embodiment of the present disclosure, the AP or the CP may load, to a volatile memory, a command or data received from at least one of a non-volatile memory and other elements connected to each of the AP and the CP, and may process the loaded command or data. Also, the AP or the CP may store, in a non-volatile memory, data received from or generated by at least one of the other elements.

The SIM card 224 may be a card implementing a subscriber identification module, and may be inserted into a slot formed in a particular portion of the electronic device 100. The SIM card 224 may include unique identification information (e.g., integrated circuit card identifier (ICCID)) or subscriber information (e.g., international mobile subscriber identity (IMSI)).

The memory 230 may include an internal memory 232 and an external memory 234. The memory 230 may be, for example, the memory 130 illustrated in FIG. 1. The internal memory 232 may include, for example, at least one of a volatile memory (e.g., a dynamic RAM (DRAM), a static RAM (SRAM), a synchronous dynamic RAM (SDRAM), etc.), and a non-volatile memory (e.g., a one time programmable ROM (OTPROM), a programmable ROM (PROM), an erasable and programmable ROM (EPROM), an electrically erasable and programmable ROM (EEPROM), a mask ROM, a flash ROM, a Not AND (NAND) flash memory, a not OR (NOR) flash memory, etc.). According to an embodiment of the present disclosure, the internal memory 232 may be in the form of a solid state drive (SSD). The external memory 224 may further include a flash drive, for example, a compact flash (CF), a secure digital (SD), a micro-secure digital (Micro-SD), a mini-secure digital (Mini-SD), an extreme digital (xD), a memory stick, or the like.

The communication interface 220 may include a wireless communication interface or a radio frequency (RF) 229. The communication interface 220 may be, for example, the communication interface 170 illustrated in FIG. 1. The wireless communication interface may include, for example, a cellular interface 221, a Wi-Fi interface 223, a BT interface 225, a GPS interface 227, or a NFC interface 228. For example, the wireless communication interface may provide a wireless communication function by using a radio frequency. Additionally or alternatively, the wireless communication interface may include a network interface (e.g., a LAN card), a modulator/demodulator (modem), or the like for connecting the hardware of the electronic device 201 to a network (e.g., the Internet, a LAN, a WAN, a telecommunication network, a cellular network, a satellite network, a POTS, or the like).

The RF 229 may be used for transmission and reception of data, for example, transmission and reception of RF signals or called electronic signals. Although not illustrated, the RF 229 may include, for example, a transceiver, a power amplifier module (PAM), a frequency filter, a low noise amplifier (LNA), or the like. Also, the RF 229 may further include a component for transmitting and receiving electromagnetic waves in a free space in a wireless communication, for example, a conductor, a conductive wire, or the like.

The sensor 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G, a red, green and blue (RGB) sensor 240H, a biometric sensor 240I, a temperature/humidity sensor 240J, an illumination sensor 240K, and a ultra violet (UV) sensor 240M. The sensor 240 may measure a physical quantity or may sense an operating state of the electronic device 100, and may convert the measured or sensed information to an electrical signal. Additionally/alternatively, the sensor 240 may include, for example, an E-nose sensor (not illustrated), an ElectroMyoGraphy (EMG) sensor (not illustrated), an ElectroEncephaloGram (EEG) sensor (not illustrated), an ElectroCardioGram (ECG) sensor (not illustrated), a fingerprint sensor (not illustrated), and the like. Additionally or alternatively, the sensor 240 may include, for example, an E-nose sensor (not illustrated), an EMG sensor (not illustrated), an EEG sensor (not illustrated), an ECG sensor (not illustrated), a fingerprint sensor, and the like. The sensor 240 may further include a control circuit (not illustrated) for controlling one or more sensors included therein.

The user input module 250 may include a touch panel 252, a pen sensor 254 (e.g., a digital pen sensor), keys 256, and an ultrasonic input unit 258. The user input module 250 may be, for example, the user input/output interface 150 illustrated in FIG. 1. The touch panel 252 may recognize a touch input in at least one of, for example, a capacitive scheme, a resistive scheme, an infrared scheme, and an acoustic wave scheme. Also, the touch panel 252 may further include a controller (not illustrated). In the capacitive type, the touch panel 252 is capable of recognizing proximity as well as a direct touch. The touch panel 252 may further include a tactile layer (not illustrated). In this event, the touch panel 252 may provide a tactile response to the user.

The pen sensor 254 (e.g., a digital pen sensor), for example, may be implemented by using a method identical or similar to a method of receiving a touch input from the user, or by using a separate sheet for recognition. For example, a key pad or a touch key may be used as the keys 256. The ultrasonic input unit 258 enables the terminal to sense a sound wave by using a microphone (e.g., a microphone 288) of the terminal through a pen generating an ultrasonic signal, and to identify data. The ultrasonic input unit 258 is capable of wireless recognition. According to an embodiment of the present disclosure, the hardware 200 may receive a user input from an external device (e.g., a network, a computer, or a server), which is connected to the communication interface 220, through the communication interface 220.

The display 260 may include a panel 262 or a hologram 264. The display 260 may be, for example, the display 160 illustrated in FIG. 1. The panel 262 may be, for example, a liquid crystal display (LCD) and an active matrix organic light emitting diode (AM-OLED) display, and the like. The panel 262 may be implemented so as to be, for example, flexible, transparent, or wearable. The panel 262 may include the touch panel 252 and one module. The hologram device 264 may display a three-dimensional image in the air by using interference of light. According to an embodiment of the present disclosure, the display 260 may further include a control circuit for controlling the panel 262 or the hologram device 264.

The interface 270 may include, for example, a high-definition multimedia interface (HDMI) 272, a universal serial bus (USB) 274, an optical interface 276, for example, a projector, and a d-subminiature (D-sub) 278. Additionally or alternatively, the interface 270 may include, for example, SD/multi-media card (MMC) (not illustrated) or infrared data association (IrDA) (not illustrated).

The audio 280 or codec may bidirectionally convert between a voice and an electrical signal. The audio 280 may convert voice information, which is input to or output from the audio 280 or codec, through, for example, a speaker 282, a receiver 284, an earphone 286, the microphone 288 or the like.

The camera 291 may capture an image and a moving image. According to an embodiment, the camera 291 may include one or more image sensors (e.g., a front lens or a back lens), an image signal processor (ISP) (not illustrated), and a flash LED (not illustrated).

The power management module 295 may manage power of the hardware 201. Although not illustrated, the power management module 295 may include, for example, a power management integrated circuit (PMIC), a charger integrated circuit (IC), or a battery fuel gauge.

The PMIC may be mounted to, for example, an IC or a SoC semiconductor. Charging methods may be classified into a wired charging method and a wireless charging method. The charger IC may charge a battery, and may prevent an overvoltage or an overcurrent from a charger to the battery. According to an embodiment of the present disclosure, the charger IC may include a charger IC for at least one of the wired charging method and the wireless charging method. Examples of the wireless charging method may include a magnetic resonance method, a magnetic induction method, an electromagnetic method, and the like. Additional circuits (e.g., a coil loop, a resonance circuit, a rectifier, etc.) for wireless charging may be added in order to perform the wireless charging.

The battery fuel gauge may measure, for example, a residual quantity of the battery 296, or a voltage, a current or a temperature during the charging. The battery 296 may supply power by generating electricity, and may be, for example, a rechargeable battery.

The indicator 297 may indicate particular states of the hardware 200 or a part (e.g., the AP 211) of the hardware 200, for example, a booting state, a message state, a charging state and the like. The motor 298 may convert an electrical signal into a mechanical vibration. The processor 210 may control the sensor 240.

Although not illustrated, the hardware 201 may include a processor (e.g., a GPU) for supporting a module TV. The processor for supporting a module TV may process media data according to standards such as, for example, digital multimedia broadcasting (DMB), digital video broadcasting (DVB), media flow, and the like. Each of the above-described elements of the electronic device 201 according to an embodiment of the present disclosure may include one or more components, and the name of the relevant element may change depending on the type of electronic device. The electronic device 201 according to an embodiment of the present disclosure may include at least one of the above-described elements. Some of the above-described elements may be omitted from the electronic device 201, or the hardware may further include additional elements. Also, some of the elements of the electronic device 201 according to an embodiment of the present disclosure may be combined into one entity, which may perform functions identical to those of the relevant elements before the combination.

Figure 3:
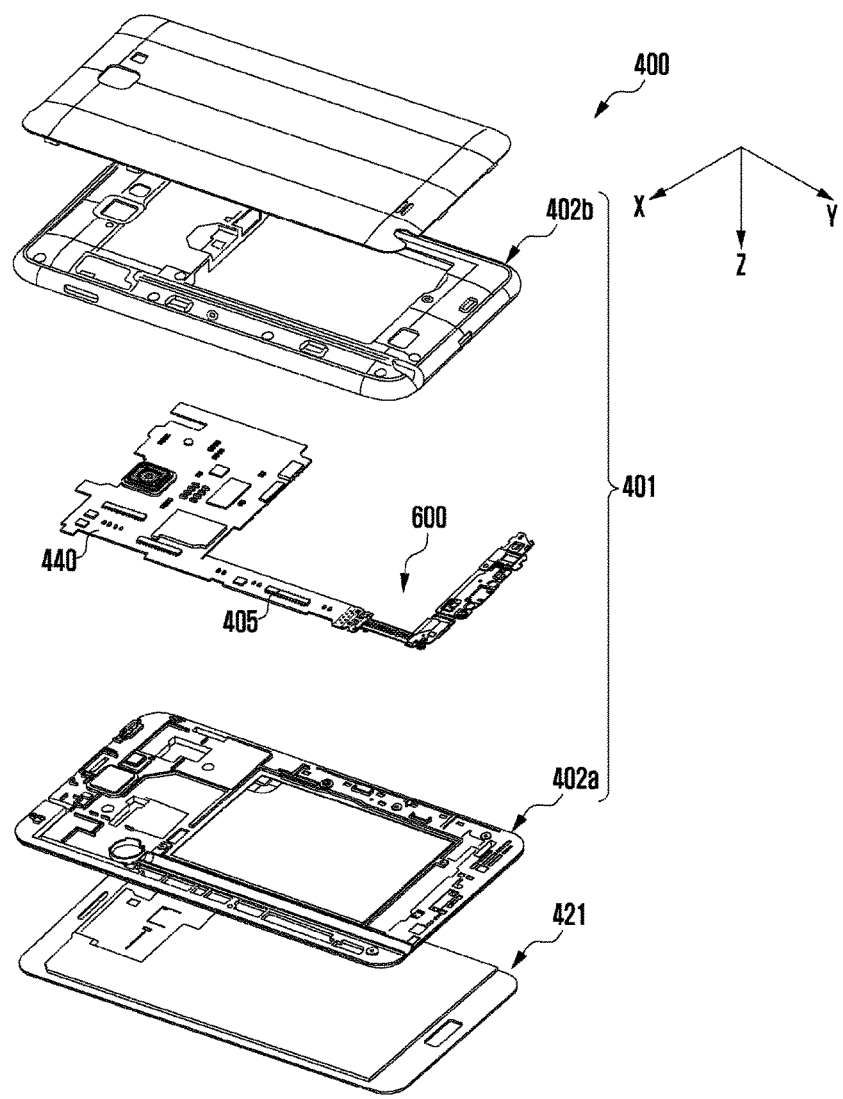
FIG. 3 illustrates an exploded perspective view of an electronic device according to various exemplary embodiments of the present disclosure.

FIG. 3 illustrates an exploded perspective view of an electronic device 400 viewed in a rear surface direction according to one of various exemplary embodiments of the present invention. The electronic device 400 may be an electronic device 101 of FIG. 1.

In FIG. 3, in a three-axis rectangular coordinate system, 'X' represents a width direction of the electronic device 400, 'Y' represents a lengthwise direction of the electronic device 400, and 'Z' represents a thickness direction of the electronic device 400.

With reference to FIG. 3, the electronic device 400 may include a housing 401, at least one plates 402a and 402b, a conductive pattern portion 405, and a control circuit (not shown) connected to the conductive pattern portion 405.

According to various exemplary embodiments, the housing 401 houses various electronic components and at least a portion thereof may be made of a conductive material. For example, the housing 401 may include side walls that form an outer side surface of the electronic device 400, and a portion exposed as an external appearance of the electronic device 400 may be made of a metal material having conductivity. A printed circuit board (PCB) 440 and/or a battery (not shown) may be received within the housing 401. For example, in the PCB 440, a processor (e.g., the processor 210 of FIG. 2), a communication interface (e.g., the communication interface 220 of FIG. 2), various interfaces (e.g., the interface 270 of FIG. 2), and a power management module (e.g., the power management module 295 of FIG. 2) may be mounted in an integrated circuit chip form, and the control circuit may be formed with an integrated circuit chip to be mounted in the PCB 440. For example, the control circuit may be a portion of the processor or the communication interface. According to various exemplary embodiments, the plates 402a and 402b may be made of a material that at least partially transmit a radio wave or a magnetic field and may include a front cover 402a mounted at a front surface of the housing 401 and a rear cover 402b mounted at a rear surface of the housing 401. The front cover 402a may include, for example a display device 421. For example, the front cover 402a may include a window member of a reinforced glass material and the display device 421 mounted at an inner side surface of the window member. A touch panel may be mounted between the window member and the display device 421. For example, the front cover 402a is an output device that outputs an image on a screen and may be used as an input device having a touch screen function. The rear cover 402b is mounted in a direction opposite to the front cover 402a and may be made of a material, for example reinforced glass or a synthetic resin that may transmit a radio wave or a magnetic field. The plate, for example the front cover 402a and the rear cover 402b may be mounted in the housing 401 to form an external appearance of the electronic device 400 together with the housing 401.

According to various exemplary embodiments, a support member (not shown) may be mounted within the housing 401. The support member may be made of a metal material and may be disposed within space formed by the housing 401 and the front cover 402a. For example, the support member may be interposed between the display device 421 and the PCB 440. The support member 403 may prevent integrated circuit chips mounted in the PCB 440 from contacting with the display device 421 and provide an electromagnetic shielding function, thereby preventing electromagnetic interference between the integrated circuit chips. The support member may compensate rigidity of the electronic device 400. For example, the housing 401 may have a plurality of openings or recessed portions according to disposition of electronic components within the electronic device 400, and the plurality of openings or recessed portions may deteriorate rigidity of the housing 401 or the electronic device 400. The support member 403 is mounted and connected within the housing 401, thereby improving rigidity of the housing 401 or the electronic device 400.

Although not shown in detail in the drawing, according to various exemplary embodiments, various structures may be formed at a surface of the housing 401 and the support member according to disposition of electronic components disposed within the electronic device 400 and a connection structure between the housing 401 and the support member. For example, spaces that house integrated circuit chips mounted in the PCB 440 may be each formed in the housing 401 and/or the support member. Spaces that house integrated circuit chips may be formed in a recessed shape or a rib that encloses an integrated circuit chip. According to various exemplary embodiments, in the housing 401 and the support member 403, fastening bosses or fastening holes corresponding thereto may be formed. For example, by fastening a fastening member such as a screw to a fastening member or a fastening hole, the housing 401 and the support member may be connected opposite to each other or the housing 401 and the support member may be connected in a state in which the support member is housed in the housing 401.

According to various exemplary embodiments, the conductive pattern portion 405 may be mounted in the housing 401 at a surface opposite to the PCB 440. For example, the conductive pattern portion 405 may be located within space formed by the rear cover 402*b* and the housing 401. The conductive pattern portion 405 may include at least one conductive pattern, for example a plane coil, thereby transmitting and receiving a radio wave or generating a magnetic field.

According to various exemplary embodiments, a radio wave transmitted and received through the conductive pattern portion 405 or a magnetic field generated by the conductive pattern portion 405 may transmit the plate, for example the rear cover 402*b*. For example, the rear cover 402*b* may be made of a reinforced glass material or a synthetic resin material. When the rear cover 402*b* is made of a transparent material such as reinforced glass, a coated layer is formed at inner side surface or an outer side surface to hide an electronic component (e.g., the conductive pattern portion 405) or an internal structure of the rear cover 402*b*.

The PCB 440 is a rigid PCB and may mount a connector 600 according to various exemplary embodiments of the present invention.

Figure 4:
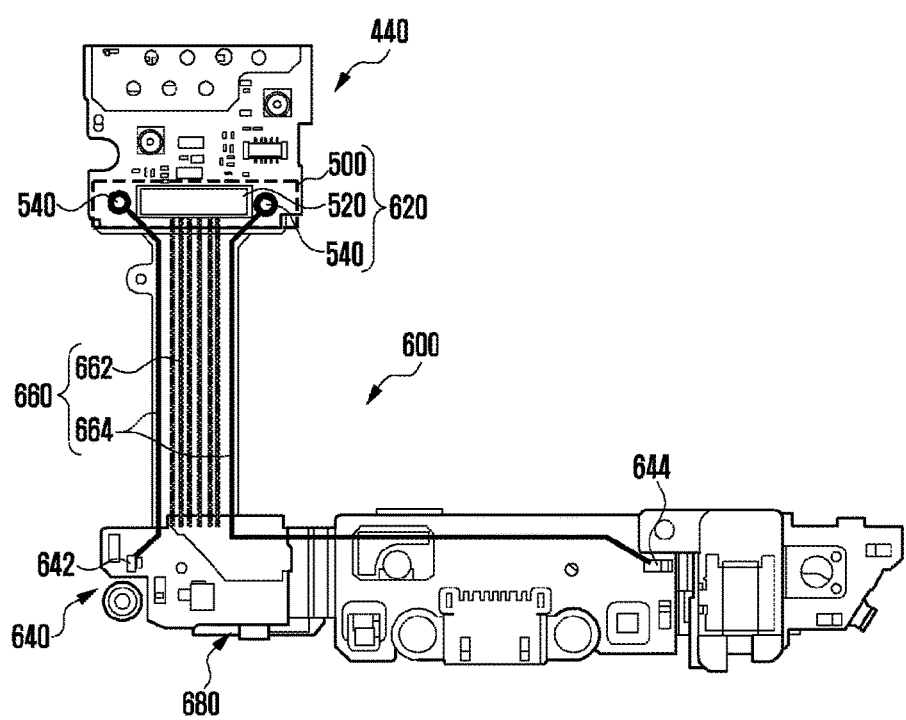
FIG. 4 illustrates a connection of an RF signal using a wiring of a PCB of an electronic device according to various exemplary embodiments of the present disclosure.

FIG. 4 illustrates connection of an RF signal using a wiring of a PCB of the electronic device of FIG. 3.

With reference to FIG. 4, an RF cable connector 600 according to various exemplary embodiments of the present invention may include a connector portion 620 of one end, a terminal portion 640 of the other end, and a signal processor 660 between the connector portion 620 and the terminal portion 640.

The connector portion 620 includes a substrate 500, a housing 520 formed with an insulator and mounted in the substrate 500 in order to connect a digital signal, and a pair of sockets 540 that connect an RF signal and may be mounted in the PCB 440 (shown in FIG. 4). The terminal portion 640 may be connected to a pair of terminals 642 and 644 formed in a sub PCB 680. The RF signal may be a high frequency signal.

The signal processor 660 may include a digital signal wiring portion 662 and a pair of RF signal wiring portions 664. The RF signal wiring portions 664 may be located at each of both sides of the digital signal wiring portion 662.

One RF signal wiring portion 664 may be connected between one socket 540 and terminal 642 of the connector portion 620, another one of the RF signal wiring portion 664 may be connected between another one socket 540 and terminal 644 of the connector portion 620, and in a connection process, impedance matching of 50Ω may be performed.

The sub PCB 680 may be mounted in the support member within the housing 401 of the electronic device 400.

Figure 5:
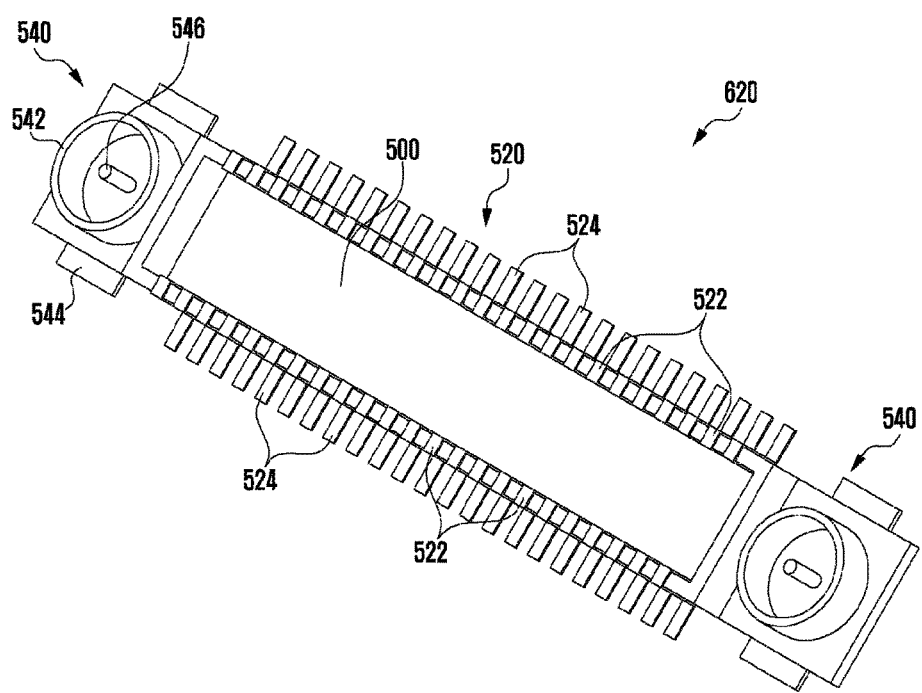
FIG. 5 illustrates a perspective view of a connector according to various exemplary embodiments of the present disclosure.
Figure 6:
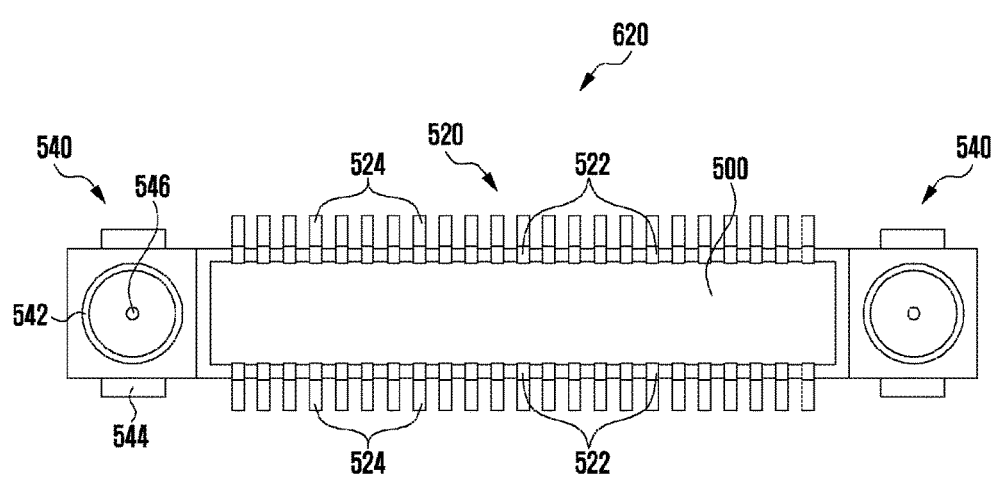
FIG. 6 illustrates a top plan view of a connector according to various exemplary embodiments of the present disclosure.
Figure 7:
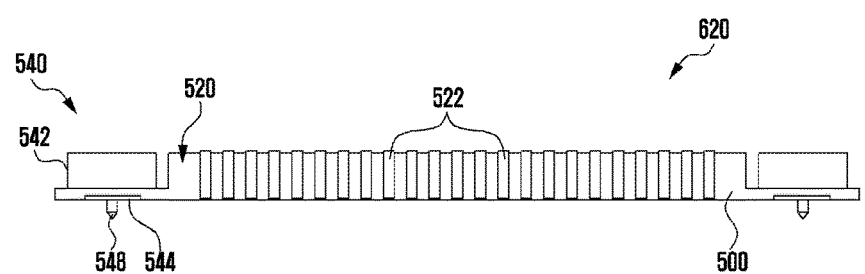
FIG. 7 illustrates a front view of a connector according to various exemplary embodiments of the present disclosure.

FIG. 5 illustrates a perspective view of a connector according to various exemplary embodiments of the present invention, FIG. 6 is a top plan view illustrating the connector of FIG. 5, and FIG. 7 is a front view illustrating the connector of FIG. 5.

With reference to FIGS. 5 to 7, at the connector portion 620 of the connector 600 according to various exemplary embodiments of the present invention, the housing 520 formed with an insulator may be installed at the center of the substrate 500, and at both sides of the housing 520, the socket 540 may be disposed.

The housing 520 is a connection portion of digital signal, and for connection of a digital signal, at one side thereof, a plurality of contact portions 522 may be disposed at an equal gap. According to an exemplary embodiment, the contact portions 522 may include an extension portion 524 enclosed from the inside toward the outside at each of upper and lower side walls and bent at the substrate 500 to be horizontally extended.

The socket 540 is a connection portion of an RF signal and may include a circular coupler 542 installed at the center of the substrate 500 of both sides of the housing 520 for connection of an RF signal, a connection plate 544 installed at a lower portion of the substrate 500, and a connection pin 546 vertically protruded at the center of the coupler 542. According to an exemplary embodiment, the connection pin 546 may include a protruding portion 548 protruded from a lower portion of the connection plate 544 to be exposed. The connection plate 544 may be protruded from an upper portion and a lower portion of the substrate 500 to be exposed from the substrate 500.

Figure 8:
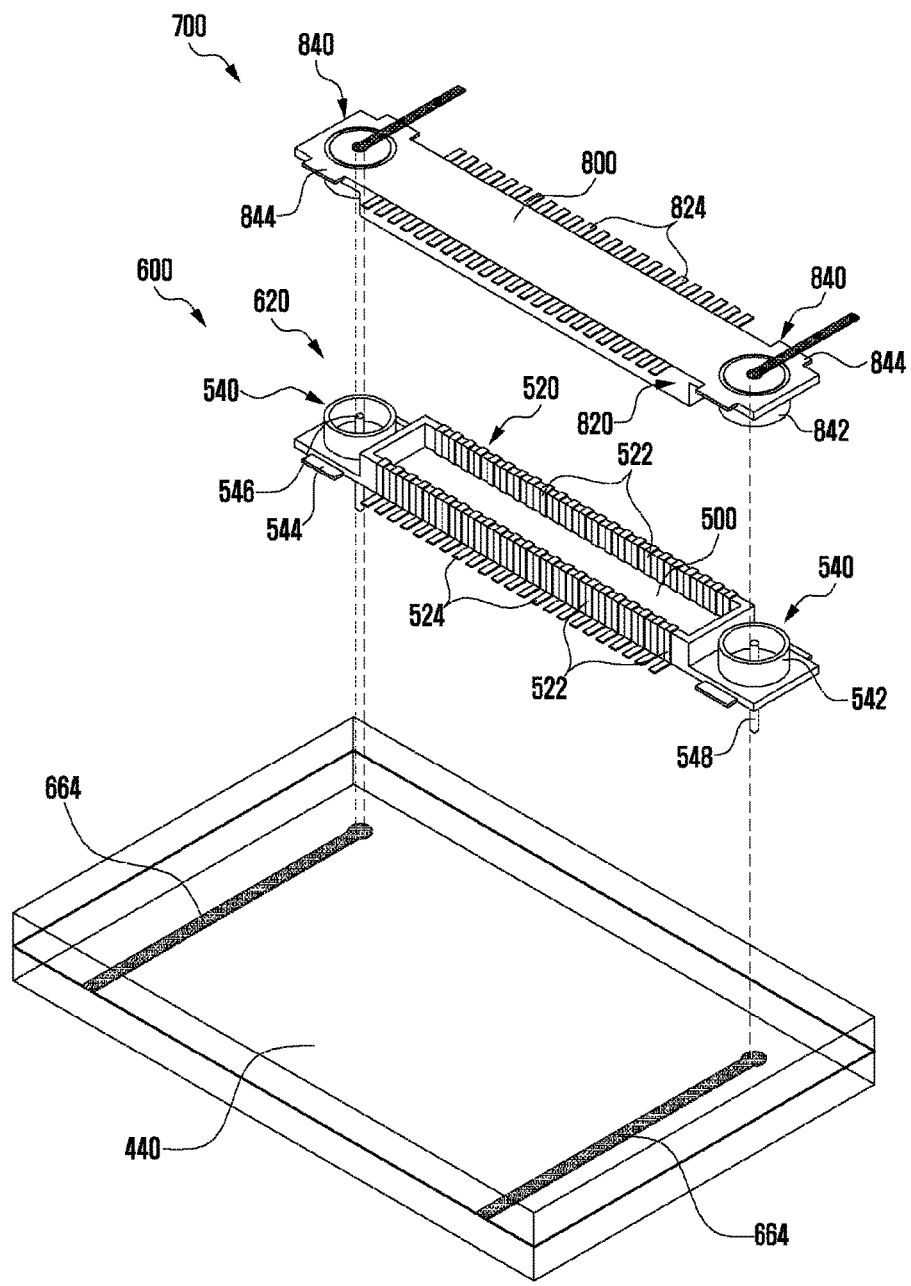
FIG. 8 illustrates an exploded perspective view of a connector formed in at least a partial area of a PCB according to various exemplary embodiments of the present disclosure.

FIG. 8 illustrates an exploded perspective view of a connector formed in at least a partial area of a PCB according to various exemplary embodiments of the present invention.

With reference to FIG. 8, when another party connector 700 corresponding to a connector 600 is inserted into the connector 600, the connector 600 according to various exemplary embodiments of the present invention may be coupled to the another party connector 700.

According to an exemplary embodiment, the connector 600 may be coupled in a vertical direction to a housing 820 and a header 840 mounted in a substrate 800 of another party connector 700.

The housing 820 of the another party connector 700 is a connection portion of a digital signal, and for connection of a digital signal, at one side thereof, a plurality of contact portions (not shown) may be disposed at an equal gap. According to an exemplary embodiment, contact portions may include an extension portion 824 vertically penetrated from the inside at each of upper and lower side walls and bent from the substrate 800 to be horizontally extended.

The header 840 is a connection portion of an RF high frequency signal and may include a circular coupler 842 installed at the center of the substrate 800 of both sides of the housing 820 for connection of an RF high frequency signal, a connection plate 844 installed at the substrate 800, and a contact pin insertion portion (not shown) vertically protruded at the center of the coupler 842.

Unlike the foregoing exemplary embodiment, the connector 600 according to various exemplary embodiments of the present invention may be inserted and coupled to another party connector 700.

According to various exemplary embodiments of the present invention, in at least a partial area of a PCB, a wiring portion and/or a connector for transferring an RF signal may be formed. For example, the wiring portion may be embedded at a first surface advancing in a connector direction of the PCB and may be electrically connected to the connector. For example, the wiring portion may be electrically connected through the connection pin 546 formed at the socket 540 of the connector 600. An electrical connection method is not limited to a method of using the connection pin 546 formed at the socket 540 and may use various methods.

The signal processor 660 of the connector 600 according to various exemplary embodiments of the present invention may be mounted in the PCB 440, and according to an exemplary embodiment, the RF signal wiring portion 664 of the signal processor 660 may be embedded in the PCB 440. The protruding portion 548 of the connection pin 546 of the socket 540 of the connector 600 according to various exemplary embodiments of the present invention may be inserted into and contact with one end of the RF signal wiring portion 664.

Figure 9:
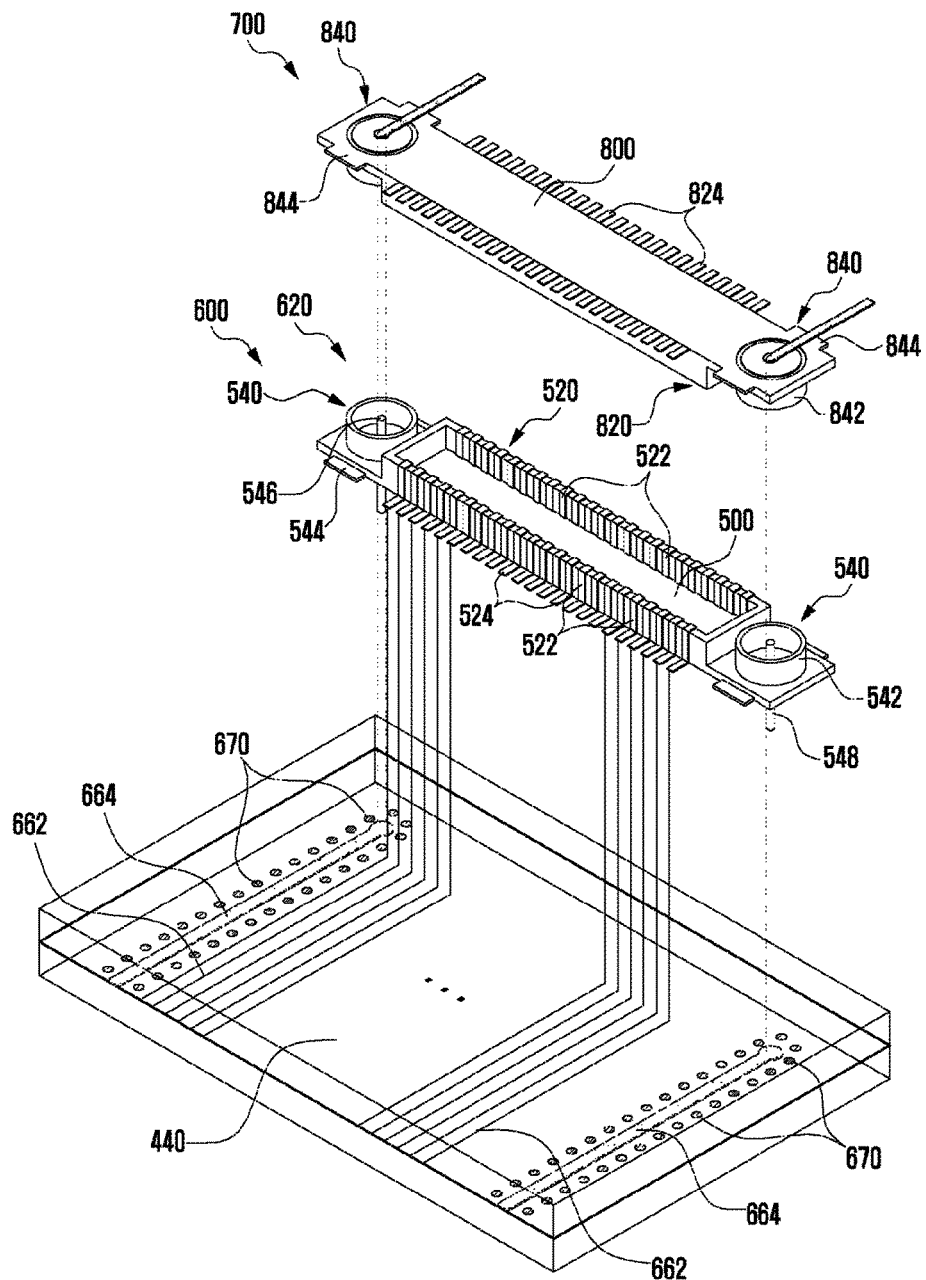
FIG. 9 illustrates an RF signal wiring and/or a digital signal wiring of a PCB electrically connected to a connector according to various exemplary embodiments of the present disclosure.

FIG. 9 illustrates an RF signal wiring and/or a digital signal wiring of a PCB electrically connected to a connector according to various exemplary embodiments of the present invention.

With reference to FIG. 9, at the center of the PCB 440, a plurality of digital signal wiring portions 662 of the signal processor 660 may be embedded at an equal gap, and at both sides of the digital signal wiring portion 662, the RF signal wiring portions 664 each may be embedded. Accordingly, because the RF signal and the digital signal may interfere, in order to prevent interference, at a periphery of the RF signal wiring portion 664, a plurality of via holes 670 are formed at an equal gap to shield interference between the RF signal and the digital signal.

Figure 10:
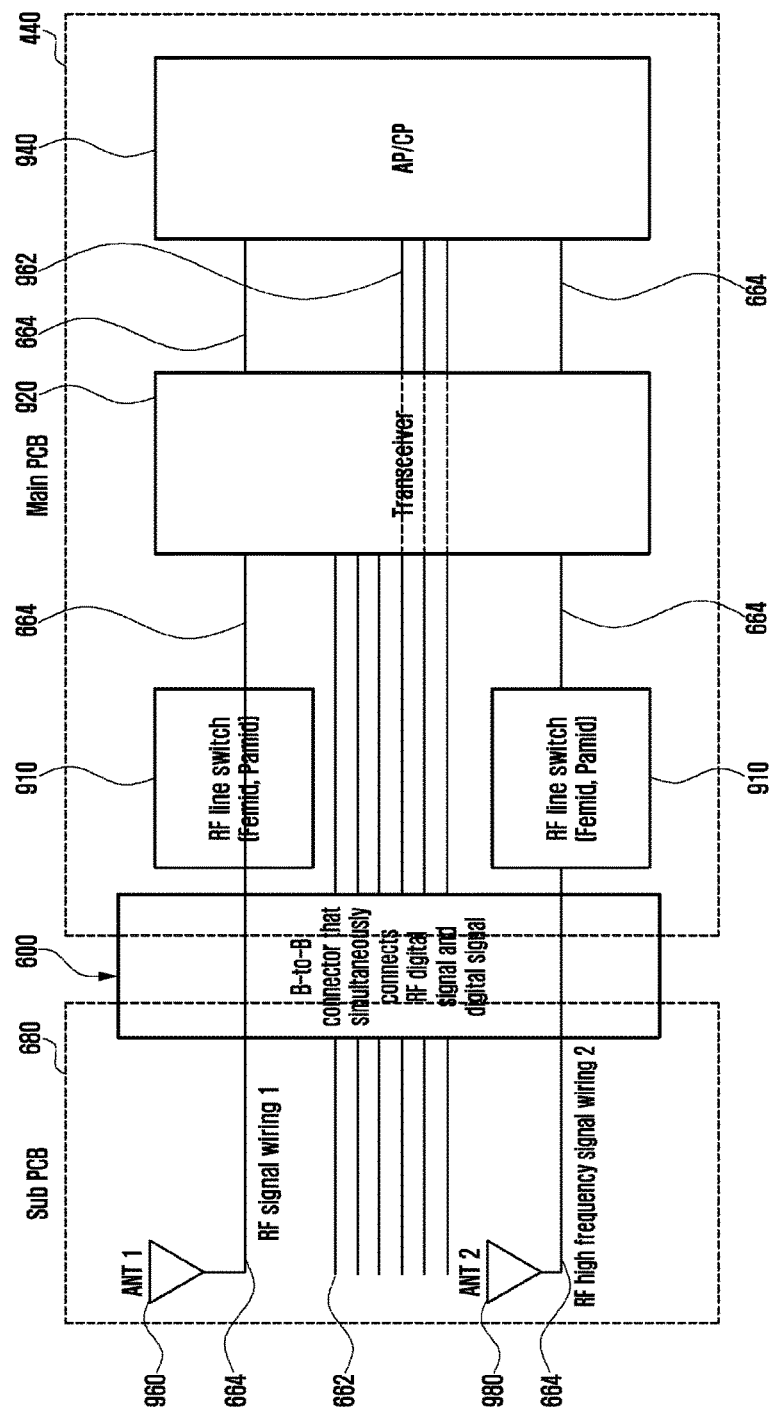
FIG. 10 illustrates a connection between an RF antenna and a processor.

FIG. 10 illustrates an entire configuration for connection between an RF antenna and a processor.

With reference to FIG. 10, the connector 600 according to various exemplary embodiments of the present invention is coupled between the main PCB 440 and the sub PCB 680 to electrically connect a digital signal and an RF signal to the main PCB 440 and the sub PCB 680. According to various exemplary embodiments of the present invention, a plurality of digital signal wiring portions 662 of the signal processor 660 may be connected to the B-to-B (B-to-B) connector 600 that simultaneously connects the RF signal and the digital signal to be connected to a transceiver 920. Further, a portion of the digital signal connected to the transceiver 920 may be connected to a processor (Application Processor (AP)/Communication Processor (CP)) 940 through the transceiver 920.

The RF signal wiring portions 664 of the signal processor 660 may be each connected between a first antenna 960 and the connector 600 and between a second antenna 980 and the connector 600 and may be connected to an RF line switch 910 through the connector 600. Further, the RF signal connected to the RF line switch 910 may be connected to the processor 940 through the transceiver 920. The RF line switch 910 is an antenna switch module, and such a module may be a front end module with integrated duplexer (FEMiD) or a power amp module with integrated duplexer (PAMiD).

The first and second antennas 960 and 980 may be mounted in the sub PCB 680 or may exist at the outside, as in a metal edge, the RF line switch 910, the transceiver 920, and the processor 940 may be mounted at the PCB 440, and the sub PCB 680 and the PCB 440 may be connected by the connector 600 according to various exemplary embodiments of the present invention.

FIGS. 11 to 15 are diagrams illustrating various shapes of a connector according to various exemplary embodiments of the present invention.

In the connector portion 620 of the connector 600 according to the foregoing exemplary embodiment embodiments, the housing 520 formed with an insulator is installed at the center of the substrate 500, and at both sides of the housing 520, the socket 540 is disposed, but may be formed in different methods.

Figure 11:
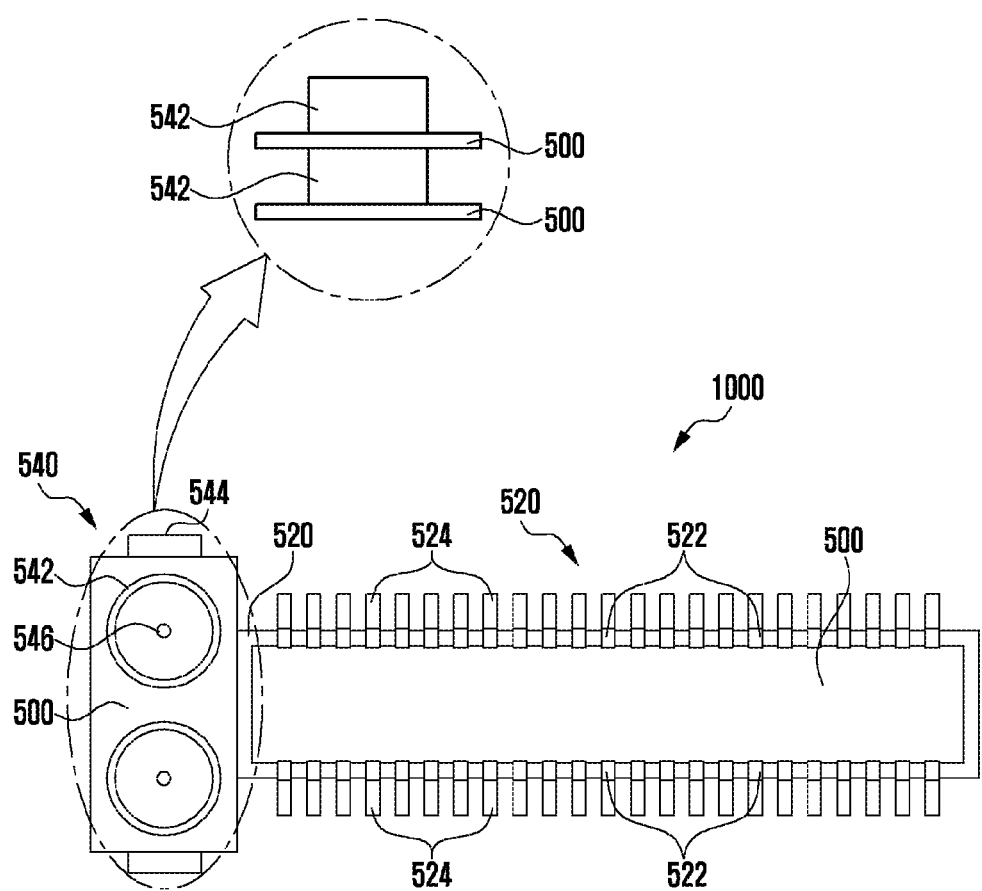
FIG. 11 illustrates a shape of a connector according to various exemplary embodiments of the present disclosure.

With reference to FIG. 11, in a connector 1000 according to various exemplary embodiments of the present invention, at any one side of the left and right sides of a housing 520 formed with an insulator, a socket 540 may be disposed. Accordingly, although not shown in detail, an RF signal wiring portion 664 of a signal processor 660 including a digital signal wiring portion 662 and a pair of RF signal wiring portions 664 may be located at one side of the digital signal wiring portion 662 according to disposition of the socket 540. The socket 540 has the same configuration as that of the foregoing exemplary embodiment and therefore a detailed description thereof will be omitted.

In an exemplary embodiment described with reference to FIG. 11, a pair of sockets 540 disposed at one side of the housing 520 may be vertically mounted at the substrate 500. For example, as the socket 540 is vertically mounted at the substrate 500, the RF signal wiring portion 664 disposed at one side of the digital signal wiring portion 662 may be vertically located and wired at one side of the digital signal wiring portion 662 to correspond to disposition of the socket 540. Further, according to an exemplary embodiment, as shown in an enlarged circle portion of FIG. 11, the RF signal wiring portion 664 may be vertically layered and disposed in at least other layers or may be disposed in various shapes such as intersection in a shape of a character '11'.

Figure 12:
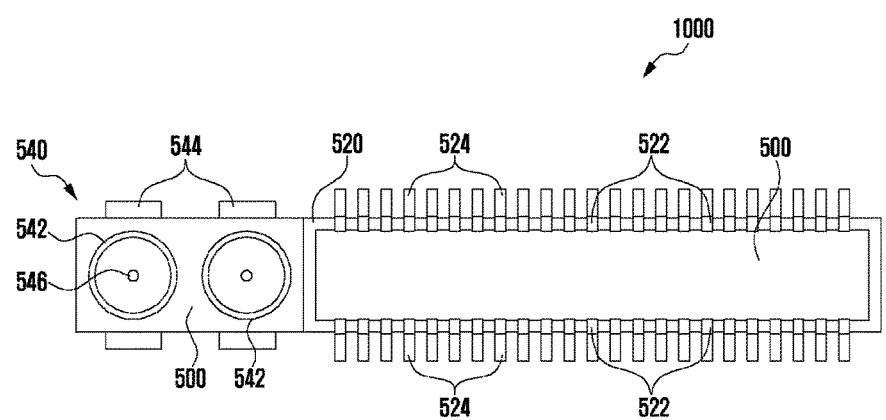
FIG. 12 illustrates a shape of a connector according to various exemplary embodiments of the present disclosure.

According to another exemplary embodiment, as shown in FIG. 12, a pair of sockets 540 disposed at one side of the housing 520 may be horizontally mounted at the substrate 500.

Figure 13:
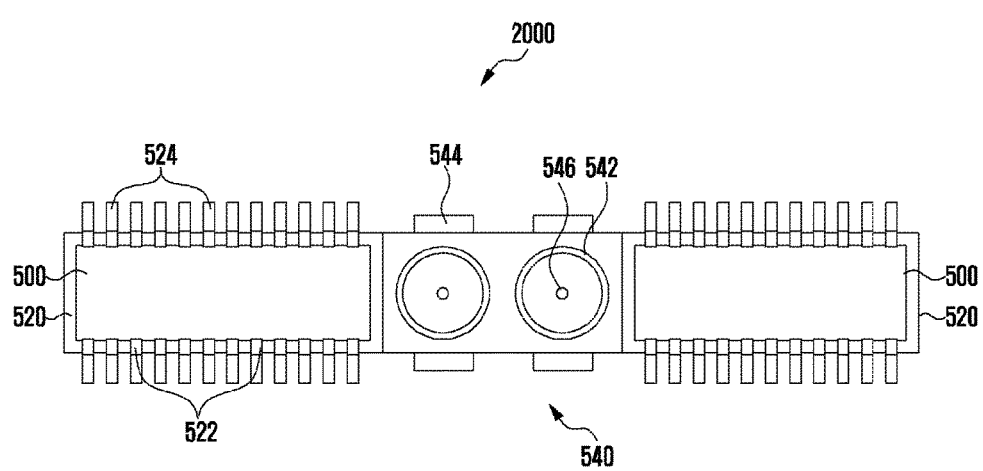
FIG. 13 illustrates another shape of a connector according to various exemplary embodiments of the present disclosure.

With reference to FIG. 13, in a connector 2000 according to various exemplary embodiments of the present invention, at the center of a housing 520 formed with an insulator, a socket 540 may be disposed. Accordingly, although not shown in detail, an RF signal wiring portion 664 of a signal processor 660 including a digital signal wiring portion 662 and a pair of RF signal wiring portions 664 may be located at the center according to disposition of the socket 540, and the digital signal wiring portion 662 may be located at both sides of the RF signal wiring portion 664.

In an exemplary embodiment described with reference to FIG. 13, a pair of sockets 540 disposed at the center of the housing 520 is horizontally mounted at a substrate 500, but alternatively, a pair of sockets 540 disposed at the center of the housing 520 are vertically mounted at the substrate 500.

Figure 14:
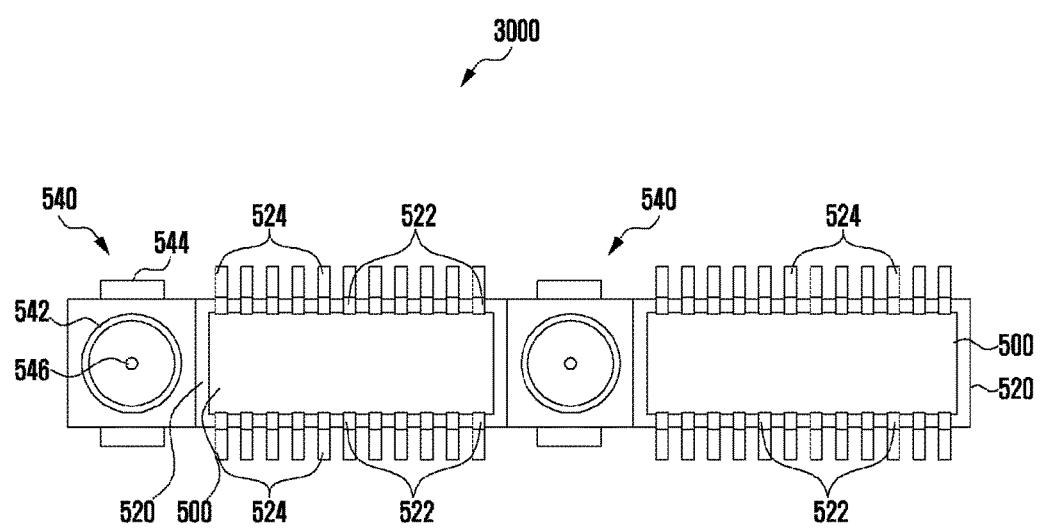
FIG. 14 illustrates yet another shape of a connector according to various exemplary embodiments of the present disclosure.

In another exemplary embodiment, with reference to FIG. 14, in a connector 3000 according to various exemplary embodiments of the present invention, at any one side and the center of a housing 520 formed with an insulator, the sockets 540 each may be mounted at the substrate 500. Accordingly, a digital signal wiring portion 662 and a pair of RF signal wiring portions 664 of a signal processor 660 may be alternately located at any one side and the center of the housing 520 according to disposition of the socket 540.

The socket 540 according to the foregoing exemplary embodiment embodiments is a connection portion of an RF signal and includes the circular coupler 542 for connection of an RF signal, but may be differently formed.

Figure 15:
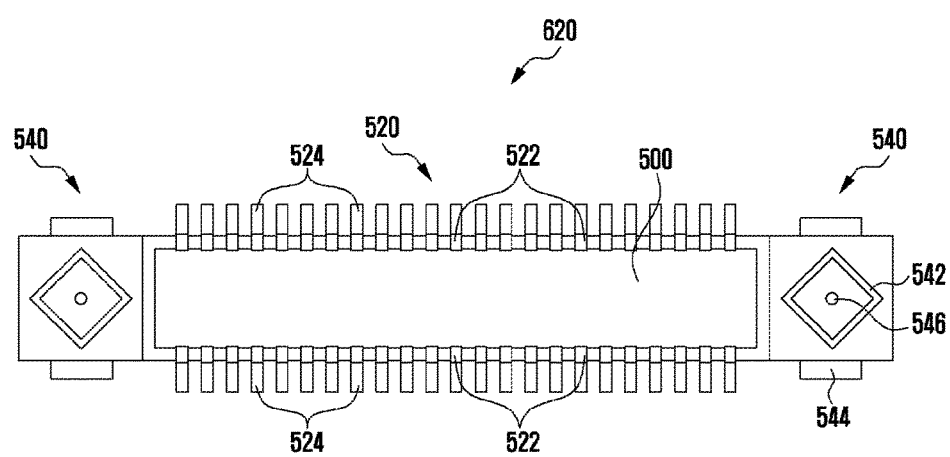
FIG. 15 illustrates yet another shape of a connector according to various exemplary embodiments of the present disclosure.

FIG. 15 illustrates a shape of at least one socket formed in a connector according to various exemplary embodiments of the present invention. A socket according to various exemplary embodiments may have various shapes such as a quadrangle, triangle, and circle. For example, the coupler 542 of the socket 540 may have a rhombus shape and may be disposed at various locations. In this way, as the socket 540 is disposed in various shapes such as a quadrangle, triangle, and circle, a header of another party connector is disposed in various shapes to correspond thereto.

As described above, because an RF cable connector according to various exemplary embodiments of the present invention is a B-to-B connector that simultaneously connects an RF signal and a digital signal, an RF cable and an RF cable connector for connecting an RF signal are not required and thus the component number and a material cost can be reduced, and because the assembly work number can be reduced in a mass production line, productivity can be enhanced.

The connector according to various exemplary embodiments of the present disclosure may include: a housing formed with an insulator and mounted at a substrate in order to process a digital signal; a pair of sockets that process a Radio Frequency (RF) signal; a pair of terminals formed at a sub Printed Circuit Board (PCB) in order to process the RF signal; and a signal processor that processes the RF signal and the digital signal.

The signal processor may include: an RF signal wiring portion that processes the RF signal; and a digital signal wiring portion that processes the digital signal, wherein the RF signal wiring portions each are located at both sides of the digital signal wiring portion.

One of the RF signal wiring portions may be connected between the at least one socket and terminal, and the other one of the RF signal wiring portions may be connected between at least another one socket and terminal.

At one side of the housing, a plurality of contact portions may be disposed at an equal gap in order to process the digital signal, and the contact portions may include an extension portion enclosed from the inside toward the outside at each of upper and lower side walls of the housing and bent at the substrate to be horizontally extended.

The socket may include a coupler, a connection plate installed at the substrate, and a contact pin vertically protruded at the center of the coupler in order to process the RF signal.

The coupler of the socket may be formed in a circular shape, a rhombus shape, or a quadrangular shape.

The connector may be coupled in a vertical direction to a housing and header mounted in another party connector, when the another party connector corresponding to the connector is inserted into the connector, may be inserted and coupled to the another party connector in which the housing and header are mounted, and may be is mounted in a Printed Circuit Board (PCB), and a digital signal wiring portion and an RF signal wiring portion of the signal processor are embedded in the PCB.

At a periphery of the RF signal wiring portion, a plurality of via holes may be formed at an equal gap.

The RF signal and the digital signal may be connected to a transceiver through the connector, and a portion of the digital signal connected to the transceiver is connected to the processor through the transceiver, and may be connected to the transceiver through the connector, and the RF signals each connected to the transceiver are connected between a first antenna and the connector and between a second antenna and the connector and are connected to the processor through the connector, the RF line switch, and the transceiver.

The RF line switch may be an antenna switch module of a front end module with integrated duplexer (FEMiD) or a power amp module with integrated duplexer (PAMiD).

The housing may be installed at the center of the substrate, and sockets each may be disposed at both sides of the housing or may be disposed at any one side of the left and right sides of the housing, and an RF signal wiring portion of the signal processor is located at one side of the digital signal wiring portion according to disposition of the socket.

At the center of the housing, the socket may be disposed, and an RF signal wiring portion of the signal processor is located at the center according to disposition of the socket, and the digital signal wiring portions are located at both sides of the RF signal wiring portion.

The socket may be horizontally or vertically mounted at the substrate.

At any one side and the center of the housing, the socket may be mounted at the substrate, and the digital signal wiring portion and a pair of RF signal wiring portions of the signal processor are alternately located according to disposition of the socket.

The electronic device according to various exemplary embodiments of the present disclosure may include: a connector including a housing formed with an insulator and mounted at a substrate in order to process a digital signal; a pair of sockets that process a radio frequency (RF) signal; a pair of terminals formed at a sub printed circuit board (PCB) in order to process the RF signal; and a signal processor implemented into a digital signal wiring portion and a pair of RF signal wiring portions in order to process the RF signal and the digital signal; and another party connector that mounts a housing and header formed to correspond to the connector to insert the connector or inserted and coupled in a vertical direction to the connector.

The connector may be mounted in a PCB, a digital signal wiring portion and an RF signal wiring portion of the signal processor are embedded in the PCB, and at a periphery of the RF signal wiring portion, a plurality of via holes are formed at an equal gap.

The example embodiments disclosed in the specification and drawings are merely presented to easily describe technical contents of the present disclosure and to aid in understanding of the present disclosure and are not intended to limit the scope of the present disclosure. Therefore, all changes or modifications derived from the technical idea of the present disclosure as well as the example embodiments described herein should be interpreted to belong to the scope of the present disclosure. Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A connector, comprising:
    a housing formed with an insulator and mounted at a substrate configured to process a digital signal;
    a pair of sockets configured to process a radio frequency (RF) signal;
    a pair of terminals formed at a sub printed circuit board (PCB) configured to process the RF signal; and
    a signal processor configured to transmit and receive the RF signal and the digital signal between the substrate and the sub PCB, wherein the housing comprises a plurality of contact portions disposed at an equal gap to process digital signal and an extension portion enclosed from an inside toward an outside of the housing.

2. The connector of claim 1, wherein the signal processor comprises:
RF signal wiring portions that process the RF signal; and
a digital signal wiring portion that processes the digital signal,
wherein the RF signal wiring portions are located at both sides of the digital signal wiring portion.

3. The connector of claim 2, wherein one of the RF signal wiring portions is connected between at least one socket of the pair of sockets and a terminal, and wherein another one of the RF signal wiring portions is connected between at least another socket of the pair of sockets and the terminal.

4. The connector of claim 2, wherein, the plurality of contact portions are disposed at one side of the housing, and wherein the extension portion enclosed from the inside toward the outside at each of upper and lower side walls of the housing and bent at the substrate to be horizontally extended.

5. The connector of claim 1, wherein the pair of sockets comprise at least one of a coupler, a connection plate installed at the substrate, or a contact pin vertically protruded at a center of the coupler to process the RF signal.

6. The connector of claim 5, wherein the coupler of the pair of sockets is formed in at least one of a circular shape, a rhombus shape, or a quadrangular shape.

7. The connector of claim 1, wherein the connector is coupled in a vertical direction to a housing and header mounted in another party connector, when the another party connector corresponding to the connector is inserted into the connector.

8. The connector of claim 7, wherein the connector is inserted and coupled to the another party connector in which the housing and header are mounted.

9. The connector of claim 1, wherein the connector is mounted in a printed circuit board (PCB), and wherein a digital signal wiring portion and an RF signal wiring portion of the signal processor are embedded in the PCB.

10. The connector of claim 9, wherein at a periphery of the RF signal wiring portion, a plurality of via holes are formed at an equal gap.

11. The connector of claim 1, wherein the RF signal and the digital signal are connected to a transceiver through the connector, and wherein a portion of the digital signal connected to the transceiver is connected to the signal processor through the transceiver.

12. The connector of claim 1, wherein the RF signal and the digital signal are connected to a transceiver through the connector, and wherein the RF signals each connected to the transceiver are connected between a first antenna and the connector and between a second antenna and the connector, and are connected to the signal processor through at least one of the connector, an RF line switch, or the transceiver.

13. The connector of claim 12, wherein the RF line switch is an antenna switch at least one of a front end module with integrated duplexer (FEMiD) or a power amp module with integrated duplexer (PAMiD).

14. The connector of claim 1, wherein the housing is installed at a center of the substrate, and wherein the pair of sockets each are disposed at both sides of the housing.

15. The connector of claim 1, wherein the pair of sockets each are disposed at one side of a left and right sides of the housing, and
an RF signal wiring portions of the signal processor is located at one side of a digital signal wiring portion according to disposition of the pair of sockets.

16. The connector of claim 1, wherein at a center of the housing, the pair of sockets are disposed, wherein an RF signal wiring portion of the signal processor is located at a center according to disposition of the pair of sockets, and wherein a digital signal wiring portion is located at both sides of the RF signal wiring portion.

17. The connector of claim 1, wherein the pair of sockets are at least one of horizontally or vertically mounted at the substrate.

18. The connector of claim 1, wherein at one side and a center of the housing, the pair of sockets are mounted at the substrate, and wherein a digital signal wiring portion and a pair of RF signal wiring portions of the signal processor are alternately located according to disposition of the pair of sockets.

19. An electronic device, comprising:
a connector including a housing formed with an insulator and mounted at a substrate configured to process a digital signal;
a pair of sockets configured to process a radio frequency (RF) signal;
a pair of terminals formed at a sub printed circuit board (PCB) configured to process the RF signal;
a signal processor configured to process a digital signal wiring portion and a pair of RF signal wiring portions that are configured to process the RF signal and the digital signal, respectively; and
another party connector that mounts a housing and header formed to correspond to at least one of the connector to insert the connector, or inserted and coupled in a vertical direction to the connector,
wherein the housing comprises a plurality of contact portions disposed at an equal gap to process the digital signal and an extension portion enclosed from an inside toward an outside of the housing.

20. The electronic device of claim 19, wherein the connector is mounted in a PCB, wherein the digital signal wiring portion and the pair of RF signal wiring portions of the signal processor are embedded in the PCB, and wherein at a periphery of the RF signal wiring portion, a plurality of via holes is formed at an equal gap.

* * * * *